United States Patent [19] | [11] 4,195,244
Heyman | [45] Mar. 25, 1980

[54] CDS SOLID STATE PHASE INSENSITIVE ULTRASONIC TRANSDUCER

[75] Inventor: Joseph S. Heyman, Gloucester, Va.

[73] Assignee: The United States of America as represented by the Administrator of the National Aeronautics and Space Administration, Washington, D.C.

[21] Appl. No.: 928,130

[22] Filed: Jul. 26, 1978

[51] Int. Cl.[2] .............................................. H01L 41/18
[52] U.S. Cl. .................................... 310/311; 29/25.35; 310/327; 310/334; 310/360
[58] Field of Search ............... 310/311, 327, 334, 360; 29/25.35; 252/62.9; 330/5.5

[56] References Cited

U.S. PATENT DOCUMENTS

| | | | |
|---|---|---|---|
| 3,093,758 | 6/1963 | Hutson | 252/62.9 R X |
| 3,145,354 | 8/1964 | Hutson | 310/311 X |
| 3,183,359 | 5/1965 | White | 310/311 X |
| 3,234,488 | 2/1966 | Fair | 310/311 X |
| 3,240,962 | 3/1966 | White | 310/311 X |
| 3,422,371 | 1/1969 | Poirier et al. | 310/311 X |
| 3,671,193 | 6/1972 | Jaskolski | 252/62.9 R X |

OTHER PUBLICATIONS

Use of Power-Sensitive Detector in Pulse-Attenuation Measurements, by P. D. Southgate, JASA Vol. 39, #3, 1966, pp. 480-483.
Ultrasonic Tranducer Materials, by O. E. Mattiat, Plenum Press, N.Y.-London 1971, pp. 68-70, 93-96, 163-174.

*Primary Examiner*—Mark O. Budd
*Attorney, Agent, or Firm*—William H. King; John R. Manning; Howard J. Osborn

[57] ABSTRACT

A phase insensitive ultrasonic transducer which includes a CdS crystal that is annealed for a selected period of time and at a selected temperature to provide substantially maximum acoustic attenuation at the operating frequency of the transducer. Two electrodes are attached to the crystal with amplifier means and a signal processing system connected to one of the electrodes to provide an ultrasonic receiver.

6 Claims, 4 Drawing Figures

CDS SOLID STATE PHASE INSENSITIVE ULTRASONIC TRANSDUCER

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

The invention relates generally to ultrasonic transducers and more specifically concerns an ultrasonic transducer that is not sensitive to phase.

Ultrasonic measurements made on flat, parallel, and homogeneous samples are straightforward with either pulse echo or continuous wave techniques. Modern applications, however, have taken ultrasonics from the laboratory with controlled flatness and parallelism to the real world of nondestructive evaluation (NDE) and biological monitoring. Serious difficulty in interpreting ultrasonic data often arises for these modern applications. A significant cause of unusable data is phase modulation in the acoustic wave front due to inhomogeneous samples and nonparallel reflecting interfaces. For example, phase variations due to nonparallelism make accurate absorption measurements difficult if not impossible and lead to inhomogeneous broadening of mechanical resonance widths and modulation of pulse echo decay patterns.

In the past, ultrasonic measurements have usually been made with piezoelectric, magnetostrictive, capacitive, or electromagnetic ultrasonic transducers which are phase sensitive and convert acoustic pressure or strain into an electrical signal proportional to the average pressure or strain on the transducer. A phase sensitive transducer that is larger than the acoustic wavelength can lead to erroneous data since its output is modulated by phase as well as amplitude. Simply, one-half of the transducer could be detecting one acoustic wave and the other half of the transducer could be detecting another acoustic wave of different phase. For this simple case there would be an error in the output of the transducer since its output signal is proportional to average pressure.

A second class of detectors for making ultrasonic measurements include thermal converters and radiation pressure detectors. At present, these are complex, bulky, physical devices that require awkward configurations and are not appropriate for general NDE ultrasonics although they are phase insensitive.

A third class of devices for making ultrasonic measurements are the photoconductive Acoustoelectric Transducer (AET) devices which depend on photon generated charge carriers to couple to the acoustic wave. As such, they require a light source which is an important source of electrical noise due to intensity fluctuations and furthermore necessitate transparent electrodes on a CdS crystal. The conductivity in the crystal may be quite nonuniform leading to variations in the output transfer function of the crystal.

It is therefore the primary purpose of this invention to provide a simple inexpensive acoustoelectric transducer that is phase insensitive.

Another object of this invention is to provide a phase insensitive acoustoelectric transducer which does not require a light source.

Still another object of this invention is to provide both a phase sensitive as well as a phase insensitive signal for ultrasonic analysis.

An additional object of this invention is to provide a phase insensitive ultrasonic transducer that is inherently broadband.

A further object of this invention is to provide a phase insensitive acoustoelectric transducer that does not require transparent electrodes on the crystal.

Other objects and advantages of this invention will become apparent hereinafter and in the drawings.

SUMMARY OF THE INVENTION

The invention is a phase insensitive ultrasonic transducer connected to other circuitry to form an ultrasonic receiver. The ultrasonic transducer includes a cadmium sulfide (CdS) crystal with two electrodes attached to the crystal. The crystal is annealed for a period of time and at a temperature to provide substantially maximum acoustic attenuation at the operating frequency of the transducer. When connected in a receiver circuit, one of the electrodes of the transducer is placed as a reference for the electronics and the other electrode is connected through amplifier means to a signal processing system. An external backing material matched to the acoustic impedance of the CdS crystal is attached to the electrode connected to the signal processing system.

DETAILED DESCRIPTION OF THE INVENTION

The AET mentioned above is a device based on phonon-charge carrier coupling in a piezoelectric semiconductor. Two fundamental relationships describe the device. The first, developed by Hutson and White and described in "Elastic Wave Propagation in Piezoelectric Semiconductors" Journal of Applied Physics, 33, page 40 (1962), provides a coupling mechanism between phonons and electrons and leads to absorption and dispersion of the acoustic wave by free charge carriers. The second relationship developed by Weinreich as described in "Ultrasonic Attenuation by Free Carriers in Germanium" Physical Review, 107, page 317 (1957) results in an electric field proportional to the acoustic energy lost to the free charge carriers. Since the electric field is proportional to the ultrasonic phonon flux, it is independent of phase information present in the acoustic wave and as such is the incentive of this invention.

Hutson and White present a linear theory that includes effects due to carrier drift, diffusion, and trapping in a piezoelectric semiconductor. In this model, the propagating acoustic stress wave is accompanied with an electric field produced by the strain on the piezoelectric crystal. The electric field is composed of both longitudinal and transverse components with the transverse wave small and therefore, neglected. The longitudinal wave, however, is sufficiently large to produce measurable effects on charge carriers. Conversely, the charge carriers play a role in the crystal's ultrasonic properties resulting in acoustic dispersion and changes in attenuation.

In the Applied Physics article cited above it is shown that changes in the ultrasonic velocity, v, due to charge carriers can be expressed as:

$$\frac{V_\infty - V}{V_o} = \frac{K^2}{2}\,\frac{(\omega_c/\omega)^2}{(1+(\omega_c/\omega)^2} \quad (1)$$

where: $v_0=(c/\rho)^{\frac{1}{2}}$, the velocity of sound, $v_\infty = v_0(1+K^2/2)$, c is the elastic constant, $\rho$ is mass density, $K^2/2$ is electromechanical coupling constant, $\omega$ is the ultrasonic angular frequency, $\omega_c$ is the "conductivity frequency" $=\sigma/\epsilon$, $\sigma$ is the conductivity, and $\epsilon$ is the dielectric permitivity. For the attenuation, the effect of charge carriers is:

$$\alpha = \frac{\omega}{V_o}\,\frac{K^2}{2}\,\frac{\omega_c/\omega}{(1+(\omega_c/\omega)^2} \quad (2)$$

The above two expressions assume that the diffusion frequency $\omega_D >> \omega$, as well as $\omega_D >> \omega_c$. This assumption is valid for the material used in this study (CdS) since at 300° K. $\omega_D \simeq 3\times10^{10}$ Hz.

Figure 1:
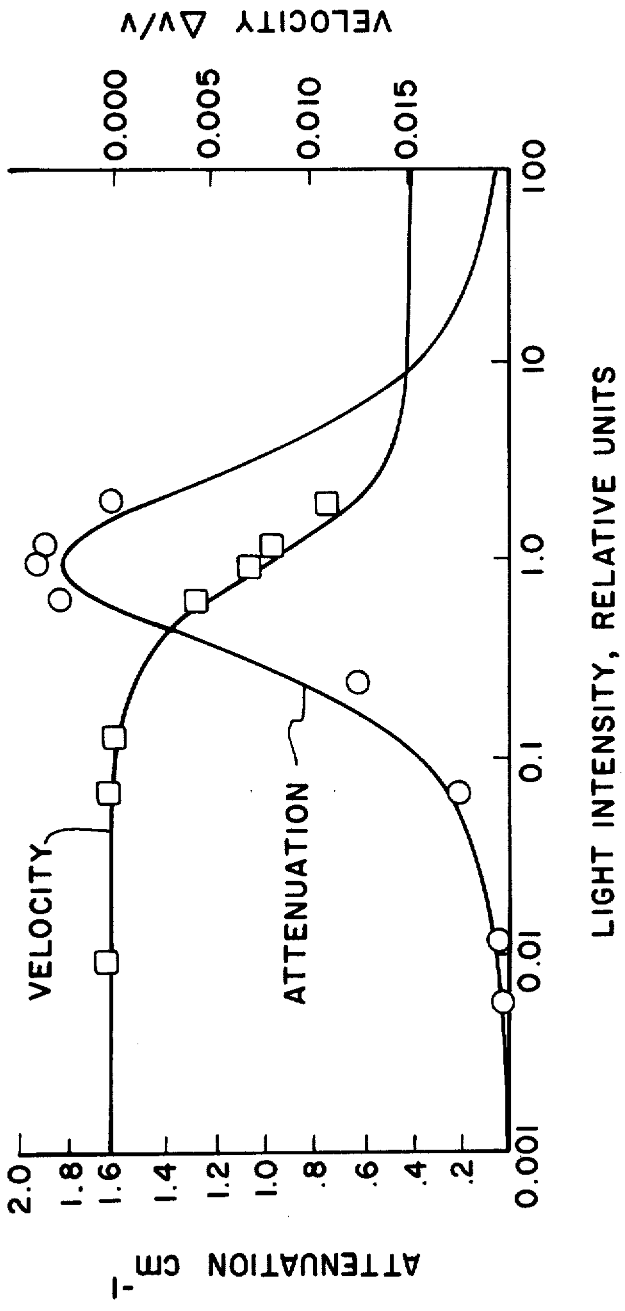
FIG. 1 is graphs of light intensity versus attenuation and velocity in a CdS crystal.

The Hutson and White theory in equations (1) and (2) predicts a relaxation type of phenomena between the acoustic wave and the charge carrier density which is shown in FIG. 1. The maximum acoustic attenuation corresponds to the condition $\omega_c=\omega$.

The results of the theory just described provide the mechanism for coupling the acoustic wave to the charge carriers in the medium. The Weinreich relationship provides the physical model to generate the acoustoelectric (AE) effect once the acoustic wave is coupled to the charge carriers. The Weinreich relationship may be written as:

$$E_{AE}=(\Phi/v)(\alpha/ne)f \quad (3)$$

where $\Phi$ is the acoustic power flux incident in the wave, v is the wave velocity, $\alpha$ is the attenuation, n is the carrier density, e is the charge per carrier, and f is the fraction of mobile space charge (1-f is trapped). Equation (3) is valid under the assumptions that $\omega_D >> \omega$ and that the drift velocity due to electric fields in the AET is much less than the ultrasonic phase velocity. One obtains the measurable quantity and acoustoelectric voltage ($V_{AE}$) by integrating the field ($E_{AE}$) through the length of the AET. If the assumption is made that the converter is flat and parallel, that insignificant mode conversion occurs at the reflection boundary and that complete reflection occurs at that boundary the $V_{AE}$ becomes:

$$V_{AE} = \int_0^{a/2} E_{AE}e^{-\alpha x}dx - e^{-\frac{\alpha a}{2}}\int_0^{a/2} E_{AE}e^{-\alpha x}dx + e^{-\alpha a}\int_0^{a/2} E_{AE}e^{-\alpha x}dx - \ldots = \frac{E_{AE}}{\alpha}\left[1-e^{-\frac{\alpha a}{2}}\right]\sum_{j=0}^{\infty}\left(-e^{-\frac{\alpha a}{2}}\right)^j \quad (4)$$

where a/2 is the AET length. If we neglect carrier trapping (valid for $\omega^{-1} >> \tau = 10^{-9}$ seconds trapping time) and combine equation (4) and equation (3), the acoustoelectric voltage becomes:

$$V_{AE} = \frac{\Phi}{nev}\left[1-e^{-\frac{\alpha a}{2}}\right]\sum_{j=0}^{\infty}\left(-e^{-\frac{\alpha a}{2}}\right)^j = \frac{\Phi}{nev}\left[\frac{1-e^{-\frac{\alpha a}{2}}}{1+e^{-\frac{\alpha a}{2}}}\right] \quad (5)$$

Figure 2:
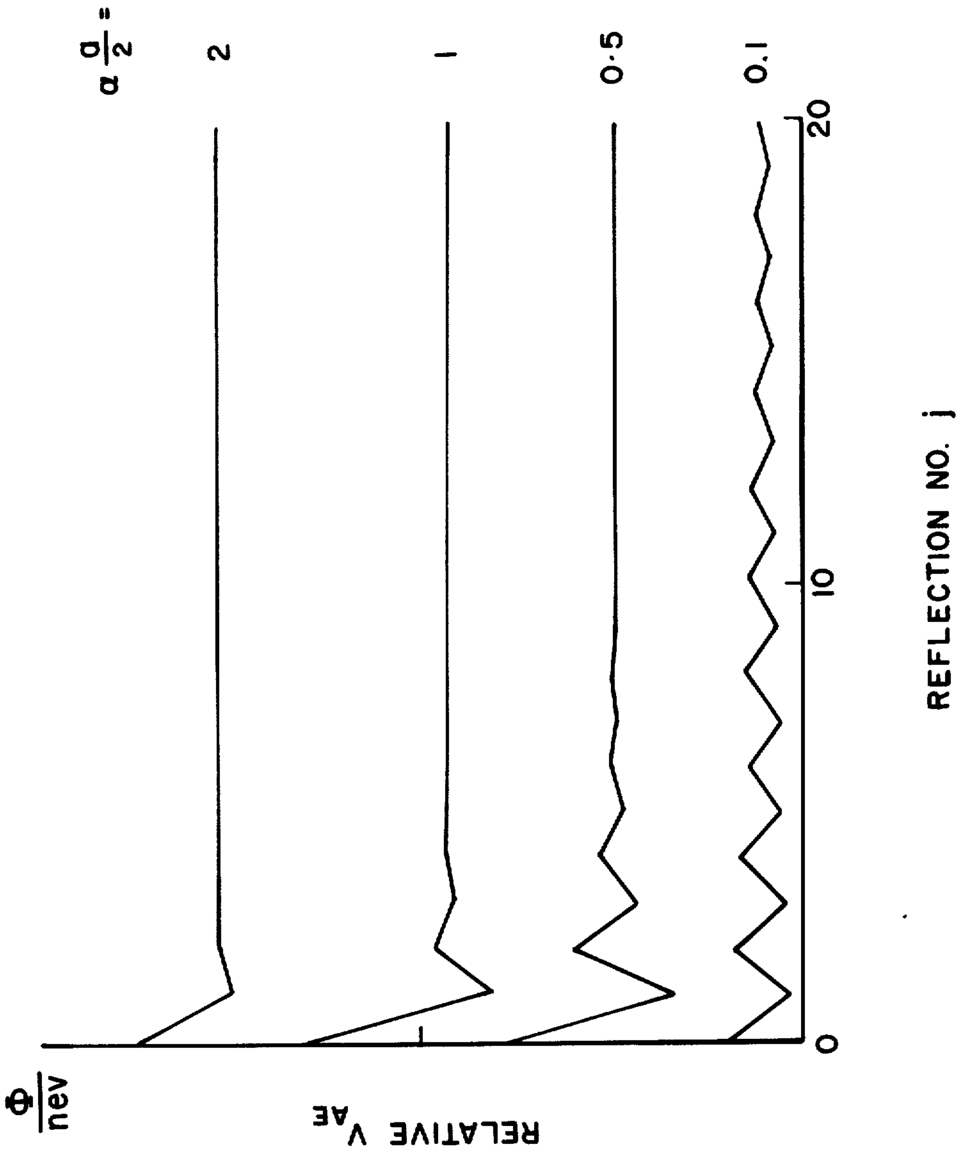
FIG. 2 is a plot of equation (5) that follows in the specification.

Thus far, only phonon-charge absorption has been considered. To more closely model a real AET, nonelectric absorption must also be included. Therefore, all the theoretical calculations in this disclosure include a 0.01 $cm^{-1}$ nonelectric background absorption (typical at 10 MHz) which adds only to the decay of the acoustic wave and not to the AET signal. A plot of equation (5) is shown in FIG. 2 for values of $\alpha a/2$ equals 0.1, 0.5, 1.0, and 2.0 for a constant n (i.e., fixed $\alpha$). Note that the oscillatory behavior of $V_{AE}$ damps out the increasing reflection number j and increasing $\alpha a/2$. In fact, for large $\alpha a/2$, $V_{AE}$ becomes a function of acoustic flux only (n fixed) and is thus inherently broadband. This condition is desirable for the AET. The acoustoelectric voltage generated for the j=0 term is larger in amplitude than for any other j value. Therefore, zero reflections in the AET achieves the optimum $V_{AE}$. Zero reflections can be achieved by properly matching the acoustic impedance of the AET with that of an external backing material such as tungsten loaded epoxy.

Figure 3:
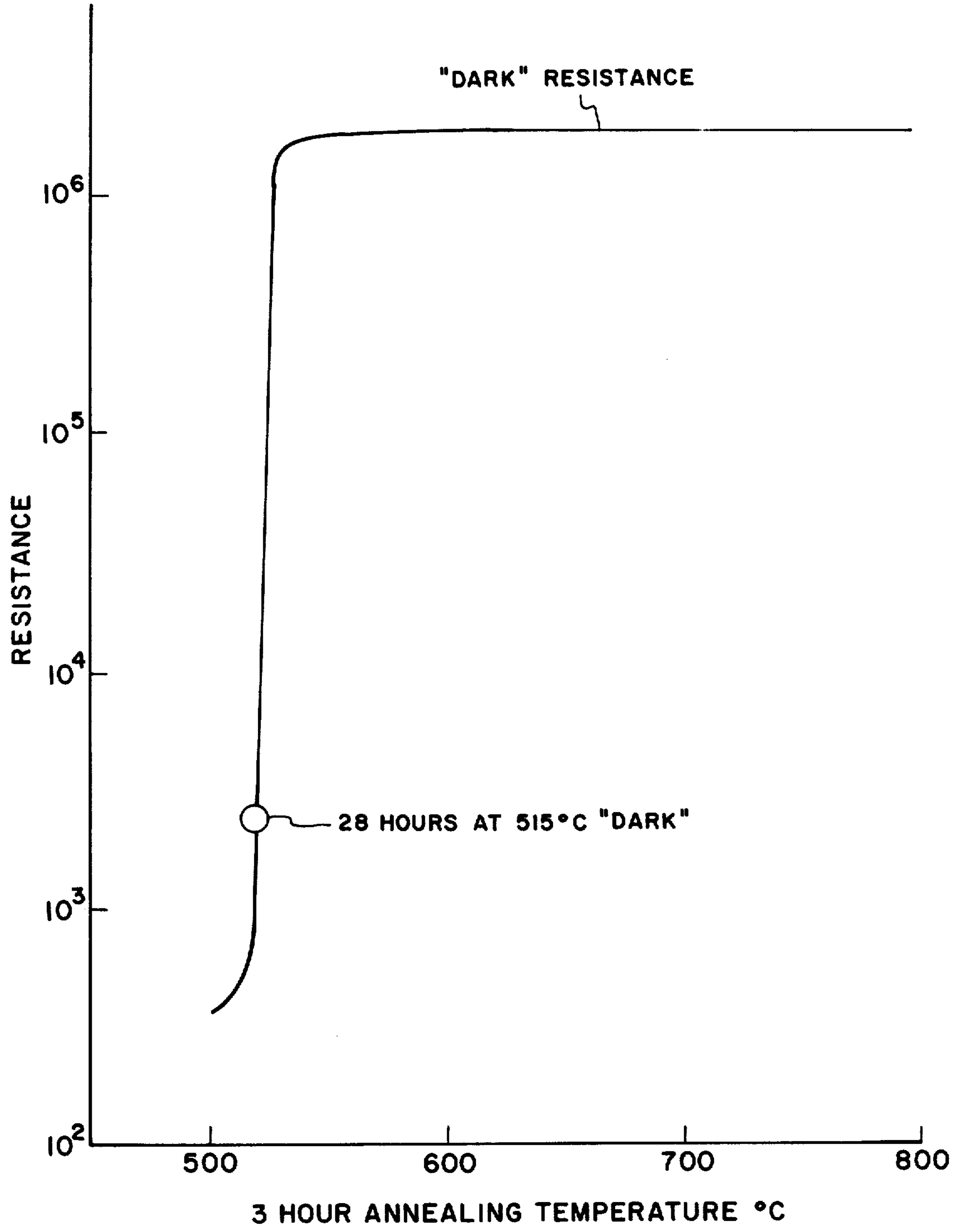
FIG. 3 is a graph of annealing temperature versus resistance in a CdS crystal.

In the present invention the desired maximum coupling of an acoustic wave to the charge carriers in a CdS crystal to fabricate an AET is accomplished by thermal annealing UHP (high conductivity) CdS in an argon atmosphere. FIG. 3 shows a graph of annealing temperature versus resistances using several samples of CdS. A three hour annealing time was used to make this graph.

As was discussed above, maximum acoustic attenuation corresponds to the condition $\omega_c=\omega$. Since we know $\omega$ (receiver frequency times $2\pi$) we know what $\omega_c$ should be. Inasmuch as the resistance, R, of an annealed sample is equal to the length of the sample, l, divided by the product of the cross-sectional area, A, of the sample times $\omega_c\epsilon$ ($R=l/(A\omega_c\epsilon)$), where $\epsilon$ is the dielectric permitivity, the annealing temperature and annealing time can be selected to make $\omega_c=\omega$.

The three hour annealing time as shown in FIG. 3 does not permit sufficient control over the material properties but was chosen for experimental purposes. Once the temperature range at which the phenomenon occurs $\omega_c=\omega$ is determined, larger anneal times can be used. For example, as shown in FIG. 3 an anneal time of 28 hours at 515° C. for a 0.7 cm×0.7 cm×0.1 cm crystal of UHP material ›ptimizes properties at an operating frequency of 5 MHz. An argon atmosphere was used to preclude any oxide formation or any other surface formation due to any actions with contaminants.

Figure 4:
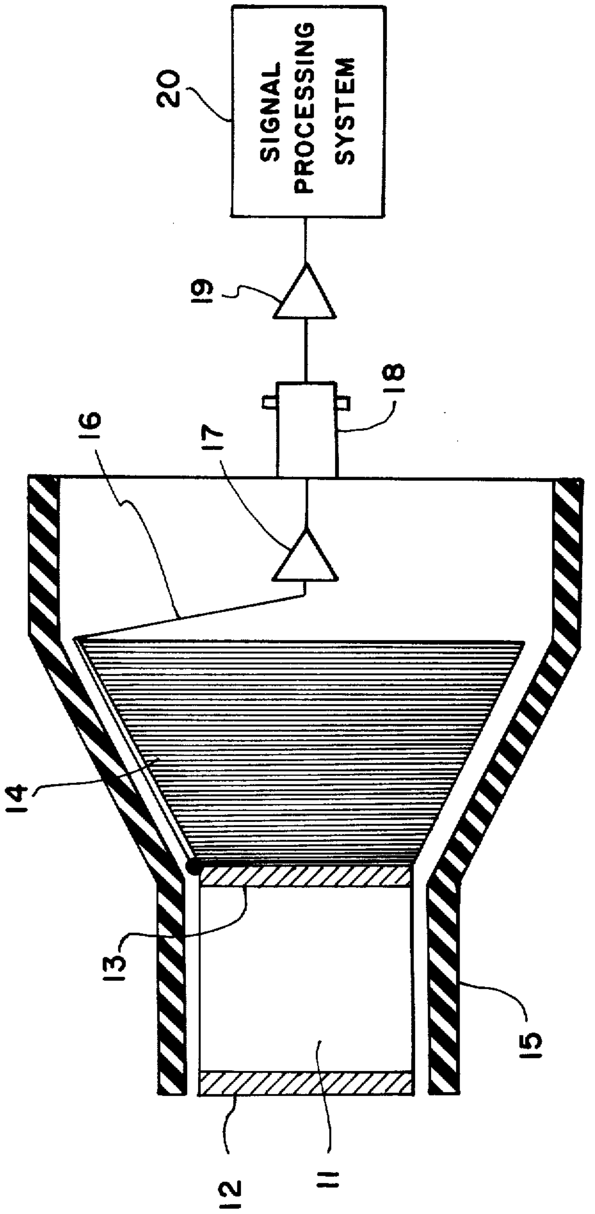
FIG. 4 is a schematic drawing of a receiver using the ultrasonic phase insensitive transducer of this invention.

Turning now to the embodiment of a receiver selected for illustrating the invention in FIG. 4, the number 11 designates a crystal of CdS UHP material that has been annealed at a temperature and for a period of time that gives it the desired properties. What is desired is that the acoustic energy be absorbed by the free charge carries in the CdS crystal. This is accomplished by maximizing the acoustic attenuation $\omega_c=\omega$ and by making the crystal length as long as practical. Once annealed electrodes 12 and 13, an external backing material (such as tungsten loaded epoxy) 14, if necessary, are applied to the crystal. The crystal along with its electrodes and backing are mounted in a convenient holder 15. An electrical connection 16 connects electrode 13 through an amplifier 17, a connector 18 and an amplifier 19 to a signal processing system 20. Amplifier 17 is mounted in holder 15 to minimize the capacitance which the AET must drive.

Variations in geometry of the crystal, electrodes, and backing material may be used to achieve special functions. Lenses may be placed in the acoustic path to concentrate the acoustic beam in the crystal. The crystal itself may be fabricated as a lens. Since the material used is piezoelectric, it may be used as a transmitter as well as a receiver by placing drive circuitry in parallel with the amplifiers. For this purpose, some tradeoffs may be desired between maximum receiver sensitivity vs. driver output. Or, the AET may be used in combination with a conventional transducer in a concentric configuration or a transmission through configuration. Other configurations and combinations are possible. Even though photoinduced conductivity has some drawbacks, there are instances where a small optical source (steady output or strobed) incident on the crystal can produce desirable effects by changing the conductivity and thereby shifting the relaxation-absorption peak in frequency. For this goal, different thermal anneals are possible so as to set the crystal dark resistivity for optimum conditions. Other materials than CdS may be utilized.

Since the material is piezoelectric, conventional phase information is also present in the electrical output and may be split off through appropriate bandpass filters. Thus, one detector can be used for both attenuation (wave amplitude) and velocity (wave phase) measurements.

By suitable application of a bias so that the carrier drift velocity is greater than the velocity in sound in equation (1), the device will amplify the acoustic wave which may then be emitted or phase insensitively measured in a nonbiased region.

Advantages of this new AET over the prior art result from its phase insensitivity which make the transducer especially useful for measurements in inhomogeneous materials and irregular geometries. Since this device is solid state, it is simple, light, small, and hard to abuse. It can be made nearly any size and shape. It has potential of significantly increasing ultrasonic resolution of material properties for both NDE and medical diagnostics imaging where phase cancellation effects modulate the acoustic transducer output.

What is claimed is:

1. An ultrasonic phase insensitive transducer comprising:

a CdS crystal annealed in an inert atmosphere at a temperature and for a period of time to provide substantially maximum acoustic attenuation at the operating frequency of the crystal; and first and second electrodes attached to said CdS crystal.

2. An ultrasonic phase insensitive transducer according to claim 1 wherein said CdS crystal is annealed at a temperature and for a period of time to make the conductivity frequency of the crystal substantially equal to the ultrasonic angular frequency.

3. An ultrasonic phase insensitive transducer according to claim 1 with crystal length as long as practical to achieve broad bandwidth operation.

4. An ultrasonic phase insensitive transducer according to claim 1 including an external backing material attached to said second electrode and matched to the acoustic impedance of said CdS crystal.

5. An ultrasonic phase insensitive transducer according to claim 4 wherein said backing material is tungsten loaded epoxy.

6. An ultrasonic phase insensitive transducer according to claim 4 including signal processing circuitry connected to said second electrode to form a receiver of ultrasonic waves striking said first electrode.

* * * * *